(12) United States Patent
Mohan et al.

(10) Patent No.: US 6,873,182 B2
(45) Date of Patent: Mar. 29, 2005

(54) PROGRAMMABLE LOGIC DEVICES HAVING ENHANCED CASCADE FUNCTIONS TO PROVIDE INCREASED FLEXIBILITY

(75) Inventors: Sushma Mohan, New Delhi (IN); Parvesh Swami, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/608,854

(22) Filed: Jun. 27, 2003

(65) Prior Publication Data

US 2004/0070422 A1 Apr. 15, 2004

(30) Foreign Application Priority Data

Jun. 27, 2002 (IN) ........................................ 693/Del/2002

(51) Int. Cl.[7] ............................................. H03K 19/177
(52) U.S. Cl. ............................ 326/40; 326/39; 326/38
(58) Field of Search ...................................... 326/38–41

(56) References Cited

U.S. PATENT DOCUMENTS 5,258,668 A    11/1993  Cliff et al.
6,066,960 A  *  5/2000  Pedersen ...................... 326/39
6,107,822 A  *  8/2000  Mendel et al. ................ 326/39
6,201,408 B1 *  3/2001  Skahill et al. ................ 326/39
6,384,627 B1 *  5/2002  Fross et al. ................... 326/39
6,480,023 B1 * 11/2002  Kaviani ........................ 326/38

* cited by examiner

Primary Examiner—Vibol Tan
(74) Attorney, Agent, or Firm—Lisa K. Jorgenson; Bryan A. Santarelli; Graybeal Jackson Haley LLP

(57) ABSTRACT

A Programmable Logic Device (PLD) incorporating a plurality of Programmable Logic Blocks (PLBs) providing enhanced flexibility for Cascade logic functions, each comprising a multi-input Look Up Table (LUT) providing one input to a Cascade Logic block for implementing desired Cascade Logic functions. The other input of the Cascade Logic block is a Cascade-In signal. A 2-input selection multiplexer receives one input from the output of the Cascade Logic block and the other from the output of the LUT for selecting either the Cascade Logic output or the LUT output as the unregistered output. The arrangement is such that the Cascade output and the multiplexer output are simultaneously available from the PLB.

27 Claims, 6 Drawing Sheets

PROGRAMMABLE LOGIC DEVICES HAVING ENHANCED CASCADE FUNCTIONS TO PROVIDE INCREASED FLEXIBILITY

PRIORITY CLAIM

This application claims priority from Indian patent application No. 693/Del/2002, filed Jun. 27, 2002, which is incorporated herein by reference.

TECHNICAL FIELD

The invention relates generally to programmable logic devices having enhanced cascade functions to provide increased flexibility.

BACKGROUND

A Programmable Logic Device (PLD) comprises a number of relatively simple logic modules with an arrangement to interconnect them in any of a wide variety of ways through a general purpose interconnection network to perform logic functions which can be quite complex. In addition, some of the logic modules include additional logic elements for concatenating the outputs of multiple modules to perform relatively complex logic functions without having to make use of the general purpose interconnection network. This additional logic is termed "Cascade Logic" and is used to implement high-speed, simple logic functions involving a large number of inputs.

U.S. Pat. No. 5,258,668 discloses a method for cascading logic units in which each logic module includes additional logic elements for forming a logical combination of the normal output signal of that logic module and the output signal from another, adjacent logic module. The output signal from the other logic module is applied directly to the additional logical element in the first logic module. The output signal of the additional logic elements in each logic module becomes the output signal of the logic module. As shown in FIG. 1, Block 20 is a 4-input look up table (LUT) providing an output 32, connected to the input of cascade logic element 22. The second input to the cascade logic element 22 is the cascade output 44 of another, preferably adjacent, programmable logic block (PLB). The cascade logic element 22 can be any desired logic gate, such as an AND gate. The logic element 22 logically combines the two signals 32 and 44 and applies the result either to a D flip flop or to the Cascade input 44 of the next PLB. The cascade output 44 or the flip flop output 38 is inverted and can be used as feedback for the LUT 20, and also serves as the logic module output 42. This method does not provide the flexibility to use the LUT output 32 and the cascade function output 44 simultaneously. That is, the LUT output is not available for other logic functions if the cascade function is implemented. In such situations, additional LUT logic is necessary to produce the required output, resulting in increased cost and delay.

FIG. 2 describes another prior-art implementation in which the cascade input 72 is gated by elements 74a and 74c. Element 74b is a programmable bit, which is programmed to indicate whether or not connection of the cascade in input to the cascade module 60 is desired. If connection of the cascade input 72 to the module 60 is desired, bit 74b is programmed to enable transistor 74a and disable transistor 74c. This applies the cascade input signal 72 to logic element 60, which here is an AND gate. The other input of block 60 is the output of LUT 50. The AND gate applies the ANDed output of the two inputs to node 76, which is the cascaded output. If connection of the cascade input 72 to the cascade logic 60 is not required, then the bit 74b is programmed to disable transistor 74a and enable transistor 74c. This applies Vcc to the second terminal of the AND gate, thereby allowing that gate to pass the output of the LVT 50 to the flip flop 70. But as with the arrangement of FIG. 1, in this arrangement only one of the outputs, that is, either the cascaded output or the LUT 50 output is available at any one time.

SUMMARY

An embodiment of the invention provides an efficient method for cascading that simultaneously provides the cascaded output and normal output of the logic module.

Another embodiment of the invention selectively provides inverted and non-inverted cascade inputs for the cascade logic.

These embodiments include a Programmable Logic Device (PLD) incorporating a plurality of Programmable Logic Blocks (PLBs) providing enhanced flexibility for cascade logic functions, each comprising a multi-input Look Up Tables (LUT) providing one input to a cascade logic block for implementing the desired cascade logic functions. The other input of the cascade logic block is a cascade-in signal. A 2-input selection multiplexer receives one input from the output of the cascade logic block and the other from the output of the LUT for selecting either the cascade logic output or the LUT output as the unregistered output. The cascade logic output and the multiplexer output are simultaneously available from the PLB.

Another embodiment of the invention further includes a flip-flop connected to the output of the selection multiplexer providing registered output to a 2-input output multiplexer for selecting either the unregistered output or the registered output as the final output of the PLB. A feedback arrangement connects the final output to the input of the LUT to enhance the flexibility of the cascade logic as well as the normal functions of the PLB.

Yet another embodiment of the invention includes a 2-input cascade input multiplexer for selecting the cascade-in signal in either its inverted or non-inverted form as one input to the cascade logic.

BRIEF DESCRIPTION OF THE DRAWINGS

Features and advantages of the invention will become more apparent in reference to the following description and the accompanying drawings, wherein.

DETAILED DESCRIPTION

Figure 1:
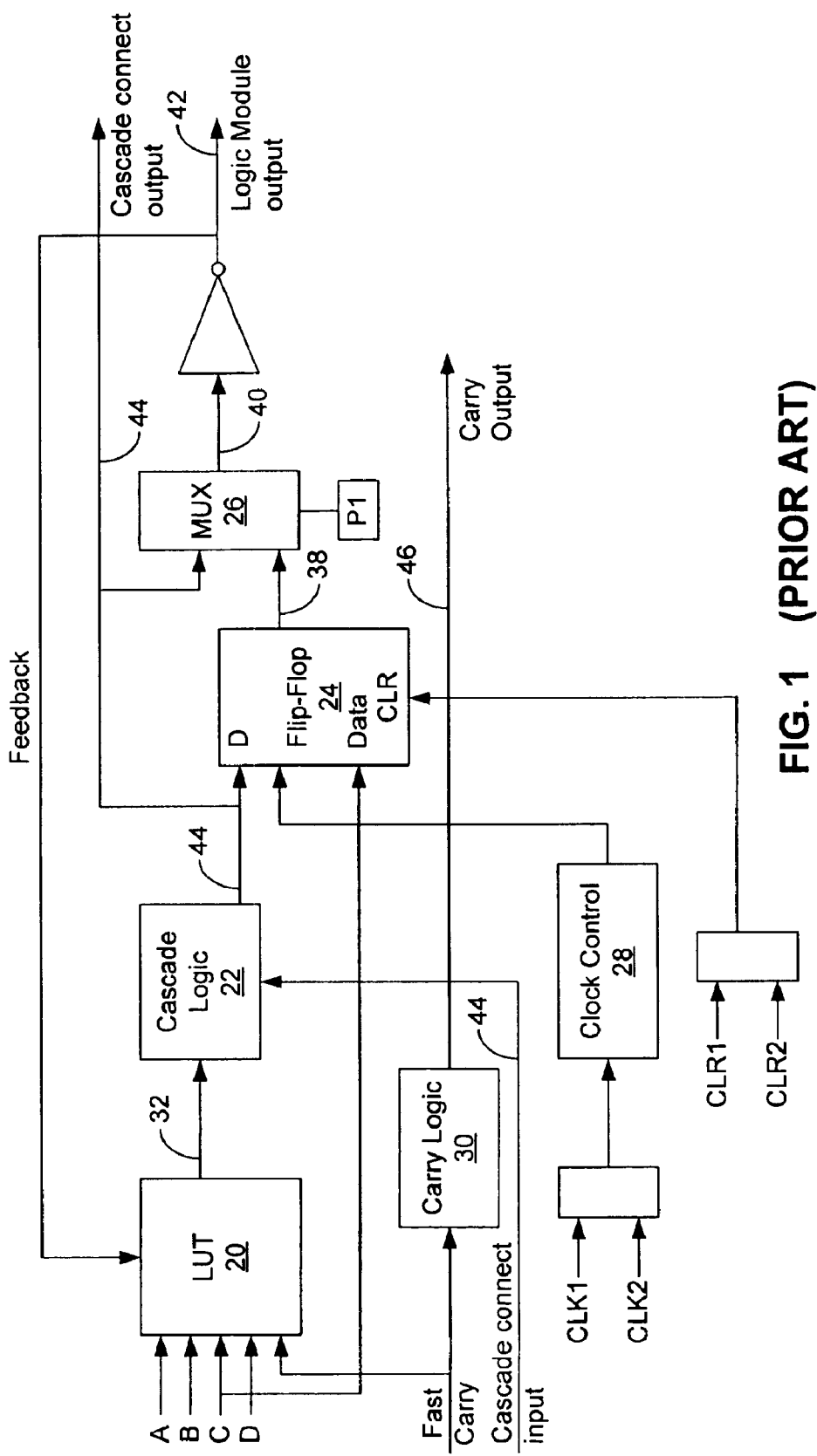
FIG. 1 shows prior art as disclosed in U.S. Pat. No. 5,258,668.

To avoid complications in the drawings and description, the invention is discussed with the simplest embodiments, but other more complicated embodiments will be evident to a person ordinarily skilled in the art. Therefore, the following description of the present invention is only illustrative and not in any way limiting.

Figure 2:
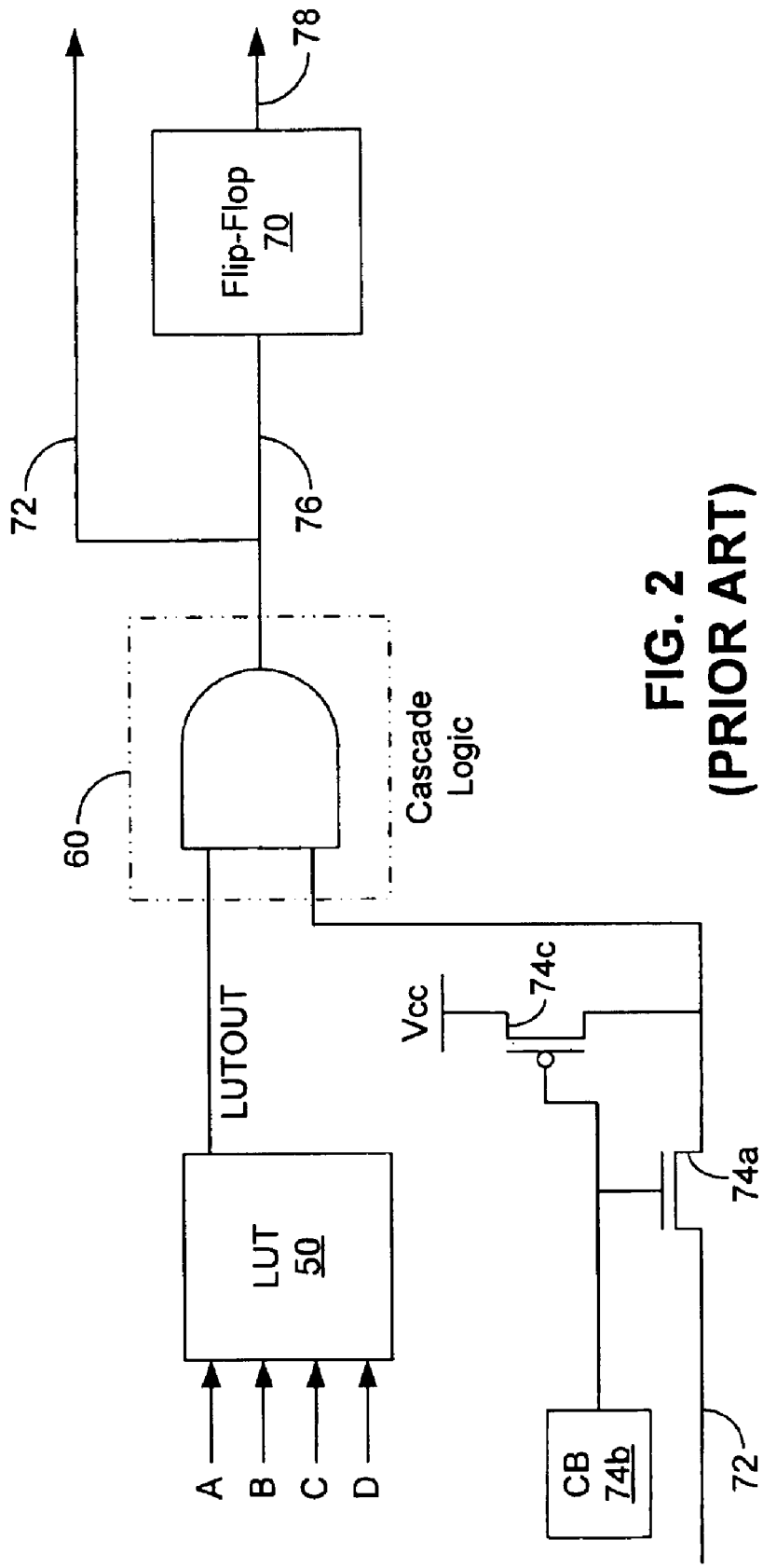
FIG. 2 shows another prior-art embodiment of the cascading method.

FIG. 1 and FIG. 2 have already been discussed in the background.

Figure 3:
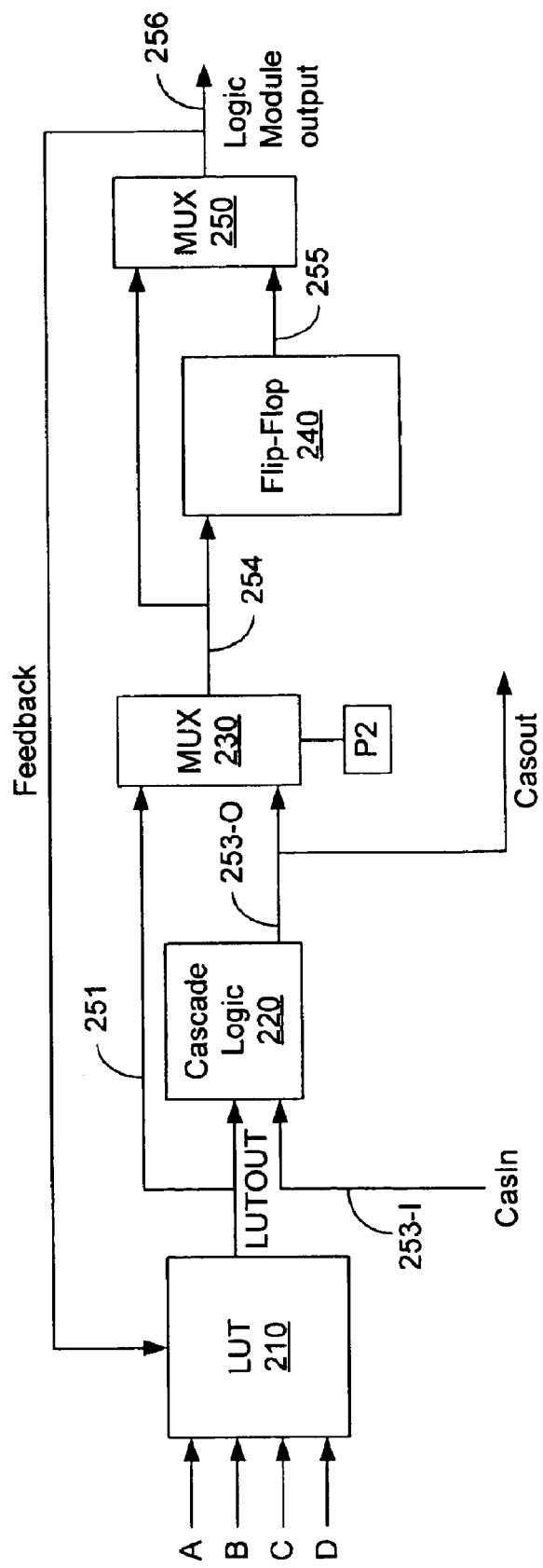
FIG. 3 shows a first embodiment of the present invention.

FIG. 3 shows one of the embodiments of the invention. The LUT 210 has four inputs (A, B, C, D) and produces the output LUTOUT 251. The output 251 of the LUT 210 is fed to the cascade logic 220. A multiplexer 230 is provided to connect either the cascade output 253-O or the LUTOUT 251 to the flip-flop 240. The configuration bit P2 is a selection bit for multiplexer 230 for determining whether the multiplexer connects LUTOUT 251 or CasIn 253 to output 254.

The cascade logic element 220 has input 253-I, which connects to the cascade output 253-O from another, preferably, adjacent cascade logic cell (not shown in FIG. 3). The cascade logic element 220 combines both the inputs LUTOUT and CasIn and provides a resulting output signal Casout 253-O.

The output 254 of the multiplexer 230 is fed to the input of the flip-flop 240. The same line 254 is extended to one of the inputs of multiplexer 250. Flip-flop 240 serves as the second input to multiplexer 250. Depending on the value of programmable bit P1, multiplexer 250 selects either the signal on line 254 or the signal on line 255 as the logic module output on line 256. This output on line 256 is fed back to the LUT 210 by line 257.

Multiplexer 230 provides flexibility for selecting either the direct output 251 of the LUT 210 or the cascade output Casout 253-O. This implementation can be used to obtain any sub function of the cascaded output Casout or direct output of the LUT 210, thereby eliminating the requirement of repeating or duplicating the same logic.

Figure 4:
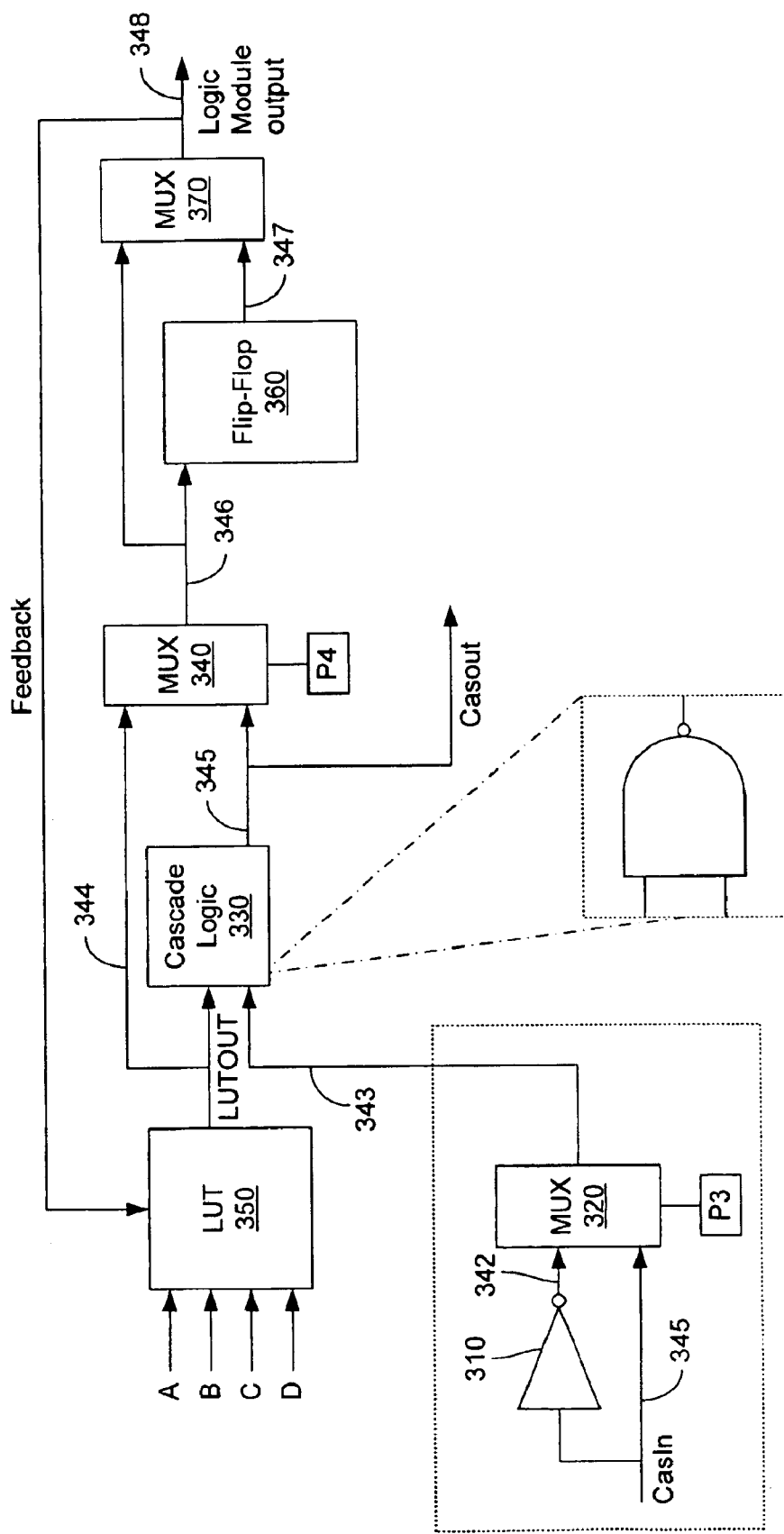
FIG. 4 shows another embodiment of the present invention.

FIG. 4 shows another embodiment of the present invention. According to this embodiment, multiplexer 320 is provided at the cascade input 343 (referring to input line 253-I of FIG. 3) before it is fed to the cascade logic cell 330. Multiplexer 320 is provided with one configurable bit P3 as the select input. One input to the multiplexer is the cascade input CasIn 345 of the previous stage while the second input is its complement 342. The remaining circuitry for cascading remains the same as described in FIG. 3. Although FIG. 4 explicitly shows the cascade logic 330 as a NAND gate, the logic 330 can be any desired logic gate or circuit. This flexibility is very useful to implement different type of complex functions, which may require that the cascade logic 330 implement functions other then AND or NAND.

Figure 5:
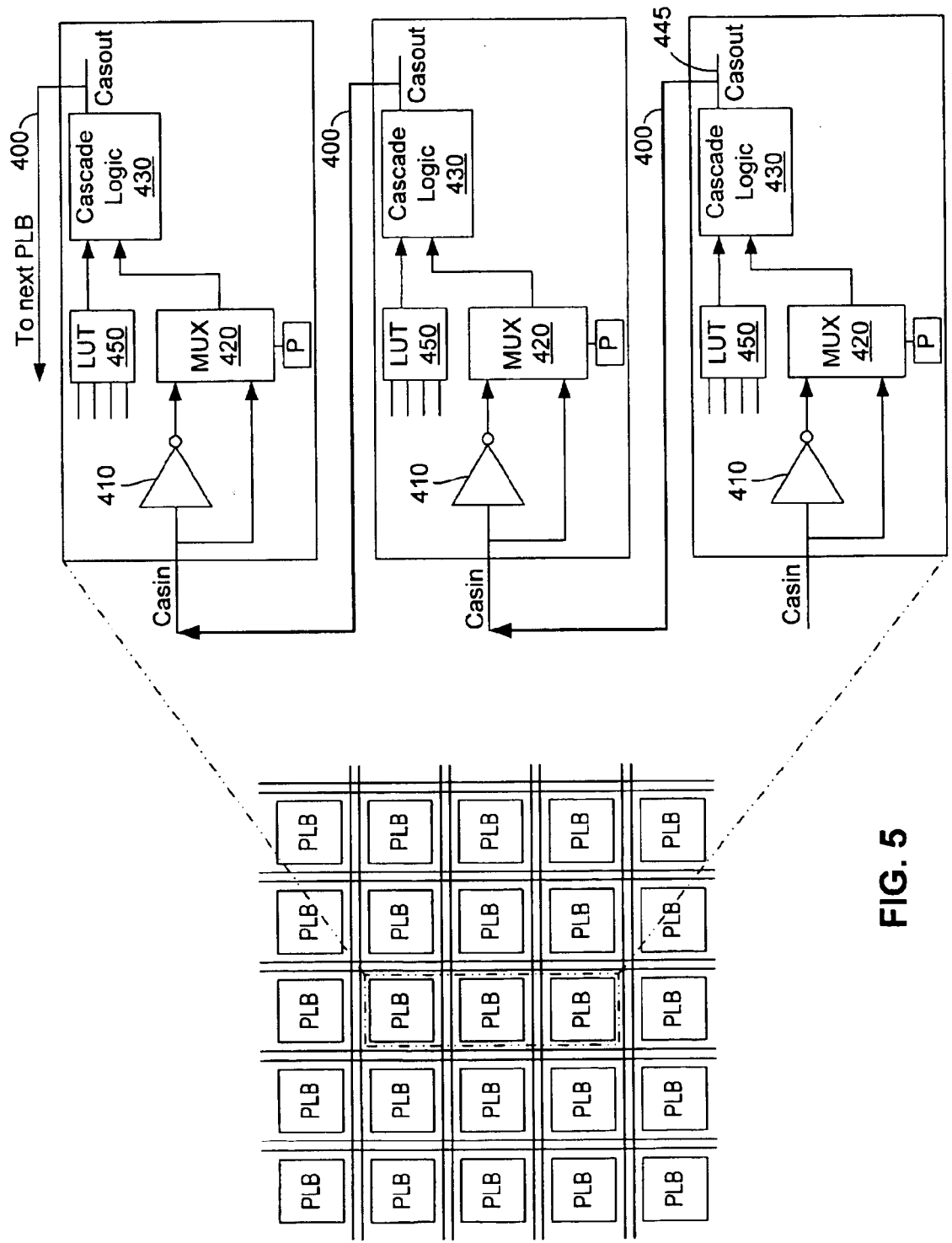
FIG. 5 shows cascading of the PLBs according to an embodiment of the invention.

FIG. 5 shows the schematic diagram of the cascade chain connectivity according to an embodiment of the invention. The cascade output casout 445 of the cascade block 430 of PLB1 is connected to the Casin input of the PLB2. Similarly connectivity is repeated for the entire PLB array.

Figure 6:
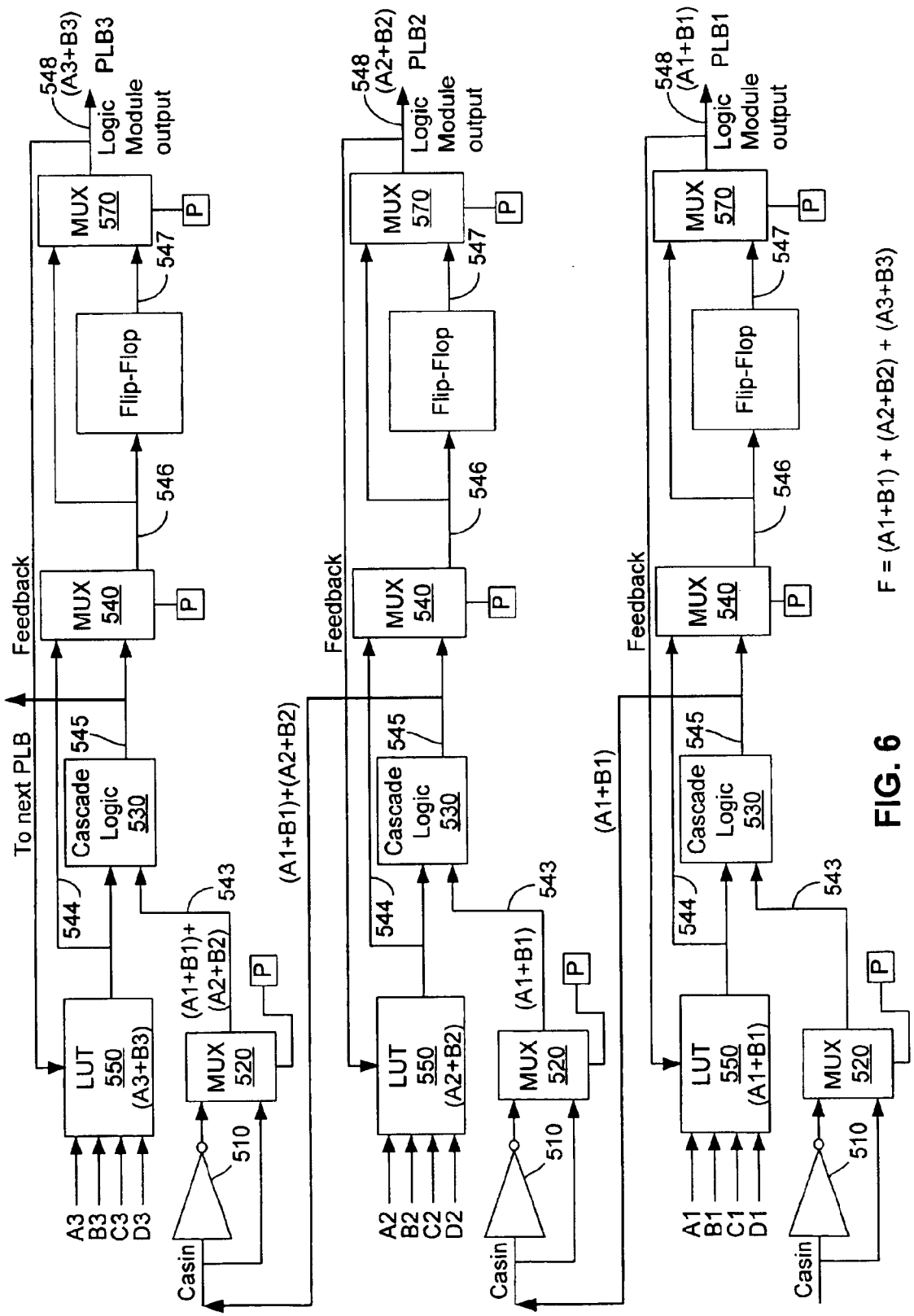
FIG. 6 shows another example of PLB cascading as applied to a particular function according to an embodiment of the invention.

FIG. 6 shows an example of implementing a function F=~((A1+B1)*(A2+B2)*(A3+B3)) using cascade logic according to an embodiment of the invention. Three PLBs PLB1, PLB2, and PLB3 are used for implementing this logic. The cascade logic 530 is configured for NAND operation. Therefore the LUT of PLB1 is programmed to produce the inverted sum of the inputs $A_1$ and $B_1$ (a NOR operation). Similarly, The LUTs of PLB2 and PLB3 are programmed to produce the sum of the inputs $A_2$, $B_2$ and $A_3$, $B_3$ respectively (OR operations). The configuration bit P of multiplexer 520 of PLB1 are configured as a "1" to pass initialization value "1", whereas the configuration bits P of multiplexers 520 of PLB2 are configured to pass the direct cascade out of PLB1 while PLB3 is configured to pass the inverted version of the cascade out of the PLB2 to produce function F at the cascade output 545 of the PLB3.

One of the advantages of this architecture is that it allows simultaneous access to the LUT and cascade outputs. As shown in the example, the LUT outputs 544 of the respective PLBs as well as the cascade outputs 545 are available at the logic module output 548 of the respective programmable logic blocks, e.g. ~(A1+B1), A2+B2, or A3+B3 can be used as a sub-function to implement some other bigger functions.

Furthermore, an Integrated Circuit (IC) such as a field-programmable gate array (FPGA) can incorporate the architectures of FIGS. 3–6, and an electronic system such as a computer system can incorporate the IC according to an embodiment of the invention.

It will be apparent to those with ordinary skill in the art that the foregoing is merely illustrative intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings.

What is claimed is:

1. A Programmable Logic Device (PLD) incorporating a plurality of Programmable Logic Blocks (PLBs) providing enhanced flexibility for Cascade logic functions, each comprising:

a multi-input Look Up Table (LUT) providing one input to a Cascade Logic block for implementing desired Cascade Logic functions receiving a Cascade-In input as the other input, and a 2-input selection multiplexer receiving one input from the output of the Cascade Logic block and the other from the output of the LUT for selecting either the Cascade Logic output or the LUT output as the unregistered output, the arrangement being such that the output of the cascade logic and the unregistered output are simultaneously available, as separate outputs of the PLB.

2. The Programmable Logic Device (PLD) as claimed in claim 1, further including a 2-input Cascade input multiplexer for selecting the Cascade-In signal in either its inverted or non-inverted form as one input to the Cascade Logic.

3. The Programmable Logic Device (PLD) as claimed in claim 1, wherein the PLB includes:

a flip flop connected to the output of the selection multiplexer for providing registered output, and a 2-input output multiplexer for selecting either the unregistered output or the registered output as the final output of the PLB.

4. The Programmable Logic Device (PLD) as claimed in claim 1 wherein the PLB includes a feedback arrangement for connecting the final output to the input of the LUT to enhance the flexibility of the Cascade Logic as well as the normal functions of the PLB.

5. A method for enhancing the flexibility of Cascade Logic functions in the Programmable logic Block (PLB) of a Programmable Logic Device (PLD), comprising the steps of:

providing a 2-input selection multiplexer for receiving one input from the output of the Cascade Logic block and the other from the output of the LUT and selecting either the Cascade Logic output or the LUT output as the unregistered output, and providing simultaneous access to the cascade logic output and the unregistered output as separate outputs of the PLB for use as sub functions in cascade logic or in other logic functions.

6. The method as claimed in claim 5, further including the steps of:

providing a flip flop connected to the output of the selection multiplexer for providing registered output, and providing a 2-input output multiplexer for selecting either the unregistered output or the registered output as the final output of the PLB.

7. The method as claimed in claim 5 further including the step of providing an arrangement for feedback of the final output to the input of the LUT to enhance the flexibility of the Cascade Logic as well as the normal functions of the PLB.

8. A method as claimed in claim 5, further including a 2-input Cascade input multiplexer for selecting the Cascade-In signal in either its inverted or non-inverted form as one input to the Cascade Logic.

9. A programmable logic block, comprising:

a logic array operable to generate a first signal;

a first cascade logic circuit coupled to the array and operable to receive a second signal from a second cascade logic circuit of another programmable logic block and to generate a third signal from the first and second signals; and a first multiplexer operable to receive the first and third signals and a first control signal and to pass either the first or third signal in response to the control signal.

10. The programmable logic block of claim 9 wherein the logic array comprises a look-up table.

11. The programmable logic block of claim 9 wherein the first cascade logic circuit comprises a logic gate.

12. The programmable logic block of claim 9, further comprising a flip flop that is operable to receive the signal passed by the multiplexer.

13. The programmable logic block of claim 9, further comprising:

a flip flop operable to receive the signal passed by the first multiplexer and to generate a flip-flop output signal from the received signal; and a second multiplexer operable to receive the signal passed by the first multiplexer, the flip flop-flop output signal, and a second control signal, and to pass either the signal from the first multiplexer or the flip-flop output signal in response to the second control signal.

14. The programmable logic block of claim 9, further comprising:

a flip flop operable to receive the signal passed by the first multiplexer and to generate a flip-flop output signal from the received signal;

a second multiplexer operable to receive the signal passed by the first multiplexer, the flip flop-flop output signal, and a second control signal and to pass either the signal from the first multiplexer or the flip-flop output signal in response to the second control signal; and wherein the logic array is operable to receive the signal passed by the second multiplexer.

15. The programmable logic block of claim 9, further comprising a second multiplexer coupled between the first cascade logic circuit and the second cascade logic circuit and operable to receive the second signal, a complement of the second signal, and a second control signal and to pass to the first cascade logic circuit either the second signal or the complement of the second signal in response to the second control signal.

16. The programmable logic block of claim 9, further comprising:

an output node; and wherein the first multiplexer is operable to pass the first or third signal to the output node.

17. An integrated circuit, comprising:

a first programmable logic block having a first cascade logic circuit operable to generate a first signal; and a second programmable logic block comprising,
a logic array operable to generate a second signal,
a second cascade logic circuit coupled to the first programmable logic block and to the logic array and operable to generate a third signal from the first and second signals, and
a multiplexer operable to receive the second and third signals and a control signal and to pass either the second or third signal in response to the control signal.

18. An electronic system, comprising:

an integrated circuit, comprising,
a first programmable logic block having a first cascade logic circuit operable to generate a first signal, and
a second programmable logic block comprising,
a logic array operable to generate a second signal,
a second cascade logic circuit coupled to the first programmable logic block and to the logic array and operable to generate a third signal from the first and second signals, and
a multiplexer operable to receive the second and third signals and a control signal and to pass either the second or third signal in response to the control signal.

19. The electronic system of claim 18 wherein the integrated circuit comprises a programmable logic device.

20. The electronic system of claim 18 wherein the integrated circuit comprises a field-programmable gate array.

21. A method, comprising:

generating a first signal with a first cascade logic circuit of a first programmable logic block;

generating a second signal with a logic array of a second programmable logic block;

generating from the first and second signals a third signal with a second cascade logic circuit of the second programmable logic block; and selectively passing either the second or third signal to an output node of the second programmable logic block.

22. The method of claim 21 wherein selectively passing the second or third signal comprises passing either the second or third signal to the output node in response to a control signal.

23. A method, comprising:

generating a first signal with a first cascade logic circuit of a first programmable logic block;

passing a second signal that is selectively equal to either the first signal or a complement of the first signal to a second cascade logic circuit of a second programmable logic block;

generating a third signal with a logic array of the second programmable logic block;

generating from the second and third signals a fourth signal with the second cascade logic circuit; and selectively passing either the third or fourth signal to an output node of the second programmable logic block.

24. The method of claim 23 wherein passing the second signal comprises setting the second signal equal to either the first signal or a complement of the first signal in response to a control signal.

25. A method, comprising:

generating a first signal with a first cascade logic circuit of a first programmable logic block;

generating a second signal with a logic array of a second programmable logic block;

generating from the first and second signals a third signal with a second cascade logic circuit of the second programmable logic block;

selectively passing either the second or third signal; and registering the passed signal.

26. The method of claim 25, further comprising selectively passing the passed signal or the registered signal to an output node of the second programmable logic block.

27. The method of claim 25, further comprising selectively feeding back the passed signal or the registered signal to the logic array.

* * * * *